(12) United States Patent
Hori et al.

(10) Patent No.: US 8,848,335 B2
(45) Date of Patent: Sep. 30, 2014

(54) ELECTROSTATIC CHUCK (75) Inventors: Hiroaki Hori, Fukuoka-ken (JP); Ikuo Itakura, Fukuoka-ken (JP); Kazuki Anada, Fukuoka-ken (JP)

(73) Assignee: Toto Ltd., Fukuoka (JP)

( * ) Notice: Subject to any disclaimer, the term of this patent is extended or adjusted under 35 U.S.C. 154(b) by 59 days.

(21) Appl. No.: 13/635,778

(22) PCT Filed: Mar. 23, 2011

(86) PCT No.: PCT/JP2011/057040
§ 371 (c)(1),
(2), (4) Date: Oct. 4, 2012

(87) PCT Pub. No.: WO2011/118659
PCT Pub. Date: Sep. 29, 2011

(65) Prior Publication Data
US 2013/0027838 A1    Jan. 31, 2013

(30) Foreign Application Priority Data

Mar. 26, 2010  (JP) ................................ 2010-073689
Mar. 18, 2011  (JP) ................................ 2011-061737

(51) Int. Cl.
*H01T 23/00*    (2006.01)
*H01L 21/683*   (2006.01)

(52) U.S. Cl.
CPC ........ *H01L 21/6833* (2013.01); *H01L 21/6831* (2013.01)
USPC .......................................... 361/234; 361/230

(58) Field of Classification Search
USPC ................................. 361/230, 234
See application file for complete search history.

(56) References Cited

U.S. PATENT DOCUMENTS

| 5,810,933 | A | 9/1998 | Mountsier et al. |
| 5,946,183 | A | 8/1999 | Yamada et al. |
| 6,023,405 | A | 2/2000 | Shamouilian et al. |
| 2007/0247779 | A1* | 10/2007 | Nakamura ................. 361/234 |
| 2008/0037194 | A1 | 2/2008 | Kamitani et al. |
| 2009/0086400 | A1 | 4/2009 | Samir et al. |
| 2009/0168291 | A1* | 7/2009 | Koyama et al. ............. 361/234 |

FOREIGN PATENT DOCUMENTS

| JP | H08-507196 A | 7/1996 |
| JP | 9-022936 A | 1/1997 |
| JP | 9-134951 A | 5/1997 |
| JP | 9-232415 A | 9/1997 |
| JP | 2002-231799 A | 8/2002 |
| JP | 2003-504871 A | 2/2003 |
| JP | 2009-105386 A | 5/2009 |
| WO | 95/20838 A1 | 8/1995 |
| WO | 01/04945 A1 | 1/2001 |
| WO | 2006/001425 A1 | 1/2006 |

* cited by examiner

*Primary Examiner* — Danny Nguyen
(74) *Attorney, Agent, or Firm* — Carrier Blackman & Associates, P.C.; Joseph P. Carrier; William D. Blackman (57) ABSTRACT

An electrostatic chuck includes: a ceramic substrate; a ceramic dielectric body provided on a top side of the ceramic substrate and having a first major surface where a processing target substrate is to be mounted; and an electrode provided between the ceramic substrate and the ceramic dielectric body. A material of the ceramic dielectric body is a ceramic sintered body. A plurality of protrusions and a groove for supplying a gas are provided on the first major surface of the ceramic dielectric body. A through hole is provided in a bottom face of the groove, the through hole penetrating to a second major surface of the ceramic substrate on a side opposite to the first major surface. A distance between the electrode and the groove is greater than or equal to a distance between the electrode and the first major surface.

12 Claims, 5 Drawing Sheets

FIG. 6 ent within the groove. In such cases, it may be that the pressure of the heat transfer gas causes the inside of the groove to assume conductivity, meaning that insulation properties between the groove and the electrode to which the high voltage is applied can no longer be maintained. The end result is insulation breakdown between the grooves and the electrode. Similarly, in the structure disclosed in Patent Document 2 in which grooves are provided between the electrodes, the distance between the grooves and the electrode is reduced, with the end result being that insulation breakdown may occur between the grooves and the electrode.

ELECTROSTATIC CHUCK

TECHNICAL FIELD

This invention relates to an electrostatic chuck.

BACKGROUND ART

In processes in which a processing target substrate is processed in a vacuum chamber, an electrostatic chuck is used as a means to fixedly hold the processing target substrate. In the electrostatic chuck, a voltage is applied to an electrode provided within the electrostatic chuck and a processing target substrate is adhered to a major surface of the electrostatic chuck by an electrostatic force. As the processing progresses, it may be necessary for the electrostatic chuck, as part of a given process, to perform actions such as rapidly heating and cooling the processing target substrate.

To meet this requirement, a Coulomb-type electrostatic chuck with low leakage between electrodes and favorable responsiveness of attachment and detachment for the processing target substrate over a wide temperature range is used. Besides the Coulomb-type electrostatic chuck, there also exists a Johnsen-Rahbek-type electrostatic chuck. However, in the Johnsen-Rahbek-type electrostatic chuck, the responsiveness of attachment and detachment of the processing target substrate and the leakage between electrodes are strongly dependent on temperature, and so this type may fail to meet the above-described requirements.

Note, however, that the electrostatic adhesion force offered by the Coulomb-type electrostatic chuck is weak relative to the electrostatic adhesion force offered by the Johnsen-Rahbek-type electrostatic chuck. Hence, in the Coulomb-type electrostatic chuck, to generate a strong electrostatic adhesion force the electrostatic chuck is required to be thin, and the voltage applied to the electrode is required to be high. As a consequence, it is necessary to improve insulation properties of Coulomb-type electrostatic chucks.

Examples of means to rapidly heat and cool the processing target substrate include a means whereby heat transfer gas is supplied between an electrostatic chuck major surface and the processing target substrate, and a means whereby a temperature control plate is added to the electrostatic chuck. For example, an electrostatic chuck with multiple protrusions, radially-extending grooves and a peripheral groove provided in the electrostatic chuck major surface has been proposed (see, for example, Patent Literature 1). In the electrostatic chuck, a comb-like electrode is provided under the electrostatic chuck major surface. Grooves for supplying the heat transfer gas are disposed so as to overlap the electrode. Further, a through hole is provided at a center of the electrostatic chuck, and the through hole communicates with radially-extending grooves. The radially-extending grooves communicate with a peripheral groove. Further, as a means to improve the insulation properties between the electrodes, a structure has been disclosed in which grooves are provided between the electrodes (see, for example, Patent Literature 2).

CITATION LIST

Patent Literature

[PLT 1]
JP 9-232415 A (Kokai)
[PLT 2]
JP 9-022936 A (Kokai)

SUMMARY OF INVENTION

Technical Problem

However, in the structure disclosed, for example, in Patent Document 1 in which the grooves and the electrode overlap, a distance between a bottom face of the groove and the electrode is reduced. When heat transfer gas is introduced into the grooves, discharge of the heat transfer gas can occur within the groove. In such cases, it may be that the pressure of the heat transfer gas causes the inside of the groove to assume conductivity, meaning that insulation properties between the groove and the electrode to which the high voltage is applied can no longer be maintained. The end result is insulation breakdown between the grooves and the electrode. Similarly, in the structure disclosed in Patent Document 2 in which grooves are provided between the electrodes, the distance between the grooves and the electrode is reduced, with the end result being that insulation breakdown may occur between the grooves and the electrode.

The problem of this invention is to provide an electrostatic chuck that is capable of rapidly heating and cooling the processing target substrate while maintaining strong insulation properties.

Solution to Problem

The first invention is an electrostatic chuck including: a ceramic substrate; a ceramic dielectric body provided on a top side of the ceramic substrate and having a first major surface where a processing target substrate is to be mounted; and an electrode provided between the ceramic substrate and the ceramic dielectric body, a material of the ceramic dielectric body being a ceramic sintered body, a plurality of protrusions and a groove for supplying a gas being provided on the first major surface of the ceramic dielectric body, a through hole being provided in a bottom face of the groove, the through hole penetrating to a second major surface of the ceramic dielectric body on a side opposite to the first major surface, and a distance between the electrode and the groove being greater than or equal to a distance between the electrode and the first major surface.

Here, the distance between the electrode and the groove is denoted as a first distance. The distance between the electrode and the first major surface is denoted as a second distance.

The first distance is defined as the shortest length of a straight line connecting the electrode and the groove.

For example, when a depth of the bottom face of the groove from the first major surface of the ceramic dielectric body is shallower than a major surface of the electrode, the first distance is defined as a length of a straight line connecting between an edge portion on the groove side of the electrode and a point of intersection of the side surface and the bottom face of the groove.

When the depth of the bottom face of the groove from the first major surface of the ceramic dielectric body is the same as or deeper than the major surface of the electrode, the first distance is defined as a distance from the edge portion on the groove side of the electrode to the side surface of the groove at the same depth as the electrode.

Further, the second distance is defined as a distance between the major surface of the electrode and the first major surface of the ceramic dielectric body.

In the following description of the invention, the first distance may sometimes also be referred to simply as "the distance between the electrode and the groove" and the second distance simply as "the distance between the electrode and the first major surface".

If the groove is disposed to overlap the electrode, the first distance between the electrode and the groove will be shorter than the second distance. Accordingly, when heat transfer gas is introduced into the groove, discharge of the heat transfer gas may occur within the groove. In this case, it may be that the inside of the groove assumes conductivity due to the pressure of the heat transfer gas, and the insulation properties between the groove and electrode to which the high voltage is being applied can no longer be maintained. The end result may be insulation breakdown between the grooves and the electrode. Similarly, in structures in which a groove is provided between electrodes, the distance between the groove and the electrode is reduced, and insulation breakdown may occur between the groove and the electrodes.

By contrast, in the first invention, the distance between the electrode and the groove, which is the first distance, is greater than or equal to the distance between the electrode and the first major surface of the ceramic dielectric body, which is the second distance. Thus, even if the heat transfer gas introduced into the grooves reaches a gas pressure at which conductivity is assumed, strong insulation properties are maintained between the groove and the electrode.

Further, the disposal of the plurality of protrusions on the first major surface of the ceramic dielectric body has the effect of making the pressure of the heat transfer gas uniform. Also, variation in the surface temperature distribution of the ceramic dielectric body is made less likely to occur, which has the effect of making the surface temperature distribution of the processing target substrate uniform. Moreover, by using a ceramic sintered body as the ceramic dielectric body, the insulation properties of the various parts of the ceramic dielectric body are made uniform and the reliability of the electrostatic chuck is improved.

The second invention, according to the first invention, is that the electrode includes at least a pair of bipolar electrodes, a voltage having a polarity is applicable to one electrode of the bipolar electrodes and a voltage having a different polarity is applicable to one other electrode of the bipolar electrodes, the one electrode and the one other electrode are provided separately, and the groove is provided between the one electrode and the one other electrode.

Disposing the groove between the bipolar electrodes that are separated by the gap makes it possible to set the first distance, which is between the electrode and the groove, to be greater than or equal to the second distance, which is between the electrode and the first major surface of the ceramic dielectric body. As a result, the insulation properties between the electrode and the groove can be set to be stronger than the insulation properties between the electrode and the first major surface of the ceramic dielectric body.

The third invention, according to the first invention, is that the electrode includes a plurality of electrode elements, a voltage of the same polarity is applicable to each of the plurality of electrode elements, the plurality of electrode elements are mutually provided separately, and the groove is provided between the separated plurality of electrode elements.

Disposing the groove between the separated electrodes makes it possible to set the first distance, which is between the electrode and the groove, to be greater than or equal to the second distance, which is between the electrode and the first major surface of the ceramic dielectric body. As a result, the insulation properties between the electrode and the groove can be set to be stronger than the insulation properties between the electrode and the first major surface of the ceramic dielectric body. Since voltages of the same polarity are applied to each of the electrodes it is less likely that a so-called potential irregularity will occur within the surface of the processing target substrate when performing plasma processing on the processing target substrate.

The fourth invention, according to the first invention, is that a depth from the first major surface to the bottom face of the groove is less than or equal to a depth from the first major surface to a major surface of the electrode.

When the depth from the first major surface of the ceramic dielectric body to the bottom face of the groove is set to be the same as or less than the depth from the first major surface of the ceramic dielectric body to the major surface of the electrode, the first distance, which is between the electrode and the groove, is lengthened by corresponding amount, thereby improving the insulation properties between the electrode and the groove.

In the case that the grooves are processed by a grinding or sandblasting process, making the processed grooves shallower brings about a corresponding reduction in the cumulative processing load. Accordingly, microcracking (microscopic defects) is less likely to occur in the bottom face of the groove. Consequently, it is less likely that a current leakage path will be formed through a microcrack.

The fifth invention, according to the first invention, is that a depth from the first major surface to the bottom face of the groove is less than a width of the groove.

By making the depth from the first major surface of the ceramic dielectric body to the bottom face of the groove less than a width of the groove, a groove process depth can be made shallower. As a result, it is less likely that variation will occur in groove depth, even when processing the grooves by grinding or sandblasting. Moreover, a conductance of the heat transfer gas within the groove is set closer to being constant, making the gas distribution rate more uniform.

The sixth invention, according to the fifth invention, is that, a tapered portion with a depth becoming gradually shallower toward an edge of the groove is provided at an edge region of the groove.

When the processing target substrate, which is an adhering target, is electrostatically adhered to the first major surface of the ceramic dielectric body and the grooves are filled with heat transfer gas, linear intersections between the side surfaces and the bottom face of the grooves form a singularities (points at which an electric field is concentrated), making it easier for discharge breakdown to occur between the groove and the electrode. By contrast, as the sixth invention, when the tapered portion, which allows the depth to become gradually shallower, is provided in the edge regions of the groove, the singularity within the groove is eliminated, the occurrence of discharge is suppressed, and discharge breakdown is less likely to occur.

The seventh invention, according to the fifth invention, is that a volume resistivity at ambient temperature of the ceramic dielectric body is not less than $1 \times 10^{14} \Omega \cdot cm$.

This means that the electrode and the groove described above can be disposed in the Coulomb-type electrostatic chuck.

The eighth invention, according to the fifth invention, is that a thickness of the ceramic substrate is greater than a thickness of the ceramic dielectric body.

By making the thickness of the ceramic substrate greater than the thickness of the ceramic dielectric body, warping of the ceramic dielectric body is suppressed.

Advantageous Effects of Invention

According to this invention, an electrostatic chuck that is capable of rapidly heating and cooling a processing target substrate, and maintains strong insulation properties is realized.

BRIEF DESCRIPTION OF DRAWINGS

[FIG. 1]
[FIG. 2]
FIGS. 2A to 2C are views of relevant part of planar forms of an electrode,
[FIG. 3]
[FIG. 4]
[FIG. 5]
[FIG. 6]

DESCRIPTION OF EMBODIMENTS

In the following, specific embodiments are described with reference to the drawings. The embodiments described below include the means to solve the above-described problem.

First, the terminology used in the embodiments of this invention is described.

(Ceramic Substrate, Ceramic Dielectric Body)

The ceramic dielectric body is a stage for mounting the processing target substrate. The ceramic substrate (also called a support substrate or intermediate substrate) is a stage for supporting the ceramic dielectric body. The ceramic substrate and the ceramic dielectric body are formed using a ceramic sintered body as material and are each of uniform thickness.

The material of the ceramic dielectric body preferably has properties suitable for operation as a Coulomb-type electrostatic chuck in the temperature range over which the electrostatic chuck is to be used, and the insulation properties within the ceramic dielectric body are preferably uniform. A ceramic sintered body has material properties which are particularly suitable. Further, sintered ceramic bodies offer excellent durability being resistant to scratching, corrosion and the like, even when used in an electrostatic chuck for long periods. Examples of ceramic sintered bodies include alumina sintered bodies, aluminum nitride sintered bodies, and sapphire sintered bodies.

Further, the material of the ceramic substrate preferably has the property of being capable of reliably supporting the ceramic dielectric body, and has uniform insulation properties throughout the ceramic substrate. With a ceramic sintered body, the ceramic dielectric body and the electrode can be sintered together, making it possible to secure strong insulation properties. In electrostatic chucks in which the ceramic dielectric body and the ceramic substrate are sintered individually and then adhered together to form a single entity, the ceramic sintered bodies can be selected to reduce the effects of sintering contraction on the electrode shape and obtain an electrode shape that conforms exactly to the desired shape.

Further, with integrated arrangements formed by adhering the ceramic dielectric body and ceramic substrate equipped with the electrode to a metal temperature control plate, the distance between the processing target substrate and the temperature control plate can be shortened and the heat conduction efficiency can be improved. Further, with arrangements in which an organic material is thermally sprayed at a major surface of the temperature control plate to improve insulation reliability between the electrode and the temperature control plate, it is possible to promote both efficiency of heat conduction and insulation reliability.

The flatness of the major surfaces of the ceramic substrate and the ceramic dielectric body is designed to be within a predetermined range. When the thickness is uniform or appropriate flatness of the major surfaces is secured, it is less likely that local stresses will be generated in each of the ceramic substrate and the ceramic dielectric body during hot press curing.

The ceramic substrate has a diameter of approximately 300 mm and a thickness of approximately 2 to 3 mm. The ceramic dielectric body has a diameter of approximately 300 mm and a thickness of approximately 1 mm. The flatness of the ceramic substrate and the ceramic dielectric body is not more than 20 μm. A variation in the thickness of the ceramic substrate and the ceramic dielectric body is not more than 20 μm. In addition, the flatness and the variation in the thickness of the ceramic substrate and the ceramic dielectric body are preferably not more than 10 μm.

(Electrode)

The electrode refers to an electrode for applying electrostatic force to the ceramic dielectric body. The electrode is built into the electrostatic chuck. When the ceramic dielectric body and the ceramic substrate are sintered together, the electrode is formed by printing a metal paste with a high melting point, such as a tungsten (W) or molybdenum (Mo), on a green sheet which is a material of the ceramic dielectric body and the ceramic substrate and then sintering the green sheet.

Alternatively, when a sintered ceramic dielectric body and a sintered ceramic substrate are bonded together, the electrode is formed in advance on the ceramic dielectric body side and the ceramic substrate and the ceramic dielectric body are bonded together so as to sandwich the electrode. At this time, the electrode is formed using a process in which a high-melting-point metal film of tungsten (W), molybdenum (Mo), titanium carbide (TiC) or the like is formed on the major surface of the ceramic dielectric substrate using a screen printing, PVC, CVD method or the like, a mask pattern is subsequently formed using a photoresist method, and the arrangement is pattern-processed using a sandblasting method or the like. The film is formed using, for example, a CVD method. A thickness of the high-melting-point metal film is not more than 1 μm.

(Groove)

The groove is a gas groove for supplying a heat transfer gas (such as helium (He), nitrogen ($N_2$), or argon (Ar)) between the ceramic dielectric body and the processing target substrate. The groove is disposed between the electrodes. The groove is formed in a process whereby the major surface of the ceramic dielectric body is covered with a resist, the resist is removed at locations of the groove, and the ceramic dielectric body exposed in the resist are processed using a sandblasting method.

(Protrusion)

The protrusions are columnar protrusions used to create space between the processing target substrate and the major surface of the ceramic dielectric body when electrostatically adhering the processing target substrate on the ceramic dielectric body. Creating the space makes it possible to efficiently supply the heat transfer gas between the processing target substrate and the major surface of the ceramic dielectric body. Further, a ring-form protrusion may be provided at the periphery of the major surface of the ceramic dielectric body to prevent emission of the heat transfer gas.

As to a form of the protrusions, it is preferable that an area of the top face of the protrusions is reduced to suppress the generation of particles from the back face side of the processing target substrate. For example, a diameter of the top face may be 0.1 mm to 0.5 mm. A height from the major surface of the ceramic dielectric body to the top face of the protrusion is preferably designed so that the conductance of the heat transfer gas is kept at an appropriate level and the pressure of the heat transfer gas is in the molecular flow region. With this arrangement, the heat transfer coefficient of the heat transfer gas is controlled by the pressure. For example, the height from the major surface of the ceramic dielectric body to the top face of the protrusions may be 3 μm to 15 μm.

A width of the ring-form protrusion is set to a value which enables the prevention of leakage of the heat transfer gas and allows heat transfer with the processing target substrate to be set to the desired value. When the objective is to prevent leakage of the heat transfer gas and reduce heat transfer, the width of the ring-form protrusion is set from 0.3 mm to 0.6 mm. When the objective is to increase heat transfer, the width of the ring-form protrusion is set from 1 mm to 3 mm. The height of the ring-form protrusion is set to match the height of the protrusions.

(Through Hole)

The through hole is a hole to introduce the heat transfer gas into the groove. When the ceramic dielectric body and the ceramic substrate are sintered together, the processing to form the through hole is performed after stacking the green sheet formed by the ingredients, and the entire arrangement is sintered. With this method, it is possible to avoid adverse effects of contraction caused by sintering (such as misalignment) in the positional relationship between the electrode and the through hole.

On other hand, when the electrostatic chuck is formed by sandwich the ceramic dielectric body and the ceramic substrate, the electrode is formed in advance on the ceramic dielectric body side and so the contraction caused by sintering does not adversely effect the electrode shape. Thus, the through hole can be provided in a predetermined position using a grinding process after bonding the ceramic dielectric body and the ceramic substrate.

(Temperature Control Plate)

The temperature control plate is a plate for heating and cooling a ceramic plate. Hence, medium paths for allowing a cooling or heating medium to flow are provided within the temperature control plate. The cooling medium or heating medium is supplied via connection to a chiller device and piping.

The material of the temperature control plate preferably has property of not causing contamination, generating dust or the like during the processing of the processing target substrate. Materials with suitable properties include metals such as stainless steel, aluminum, and titanium, alloys of these metals, and composite materials with dispersed mixtures of metals and ceramic. A specific example of such a material is aluminum A6061.

Further, an insulating film may be formed on a surface of the temperature control plate to ensure electrical insulation between a heater and the temperature control plate. For the insulating film, a thermally-sprayed alumina film is appropriate. Thermally-sprayed alumina can be manufactured using a simple process and at low cost. When aluminum is used for the temperature control plate, Alurnite (registered trademark) processing may be carried out on the surface of the temperature control plate. By performing Alurnite pore sealing, the reliability of the electrical insulation can be further improved.

Next, a configuration of the electrostatic chuck is described.

Figure 1A:
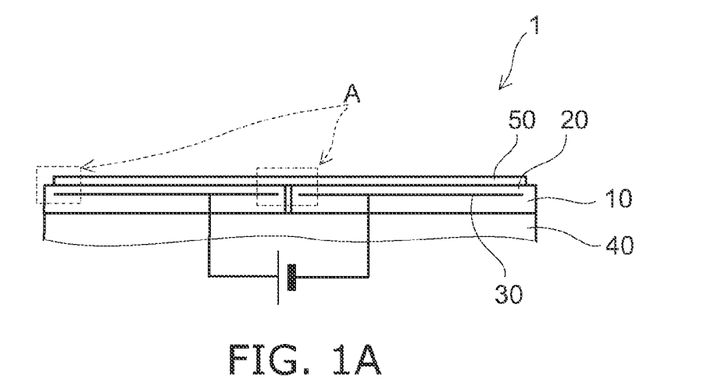
FIG. 1A is a cross-sectional view of a relevant part of an electrostatic chuck.
Figure 1B:
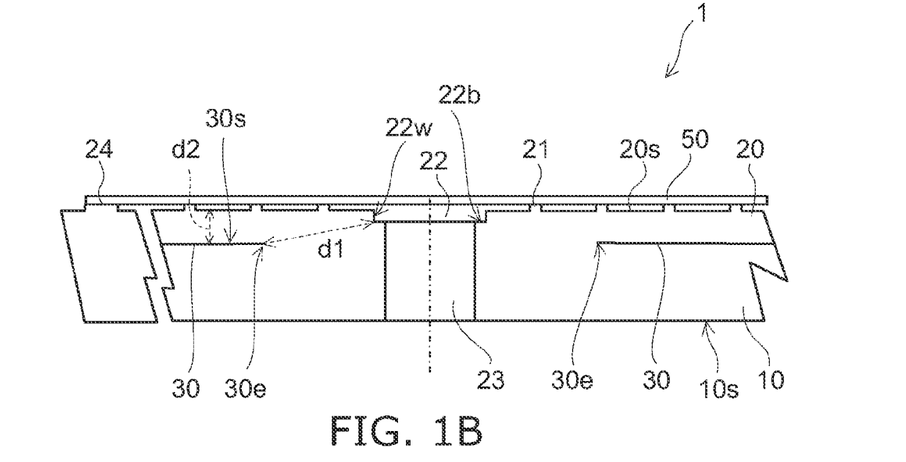
FIG. 1B is a magnified view of a surrounded portion A in FIG. 1A.
Figure 1C:
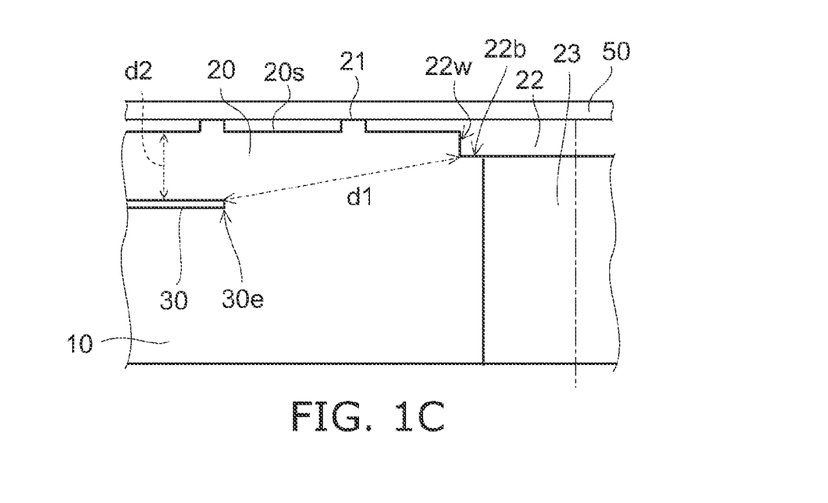
FIG. 1C is a further magnified view of a portion in FIG. 1B.

FIG. 1A is a cross-sectional view of a relevant part of the electrostatic chuck, FIG. 1B is a magnified view of a surrounded portion A in FIG. 1A, and FIG. 1C is magnified view of a portion (in proximity to groove 22) in FIG. 1B. In FIG. 1B, a central portion and a peripheral portion from FIG. 1A are shown together.

The electrostatic chuck includes a ceramic substrate 10, a ceramic dielectric body 20 provided on a top side of the ceramic substrate 10, having a first major surface 20s where a processing target substrate 50 is to be mounted, and an electrode 30 provided between the ceramic substrate 10 and the ceramic dielectric body 20. For a material of the ceramic dielectric body 20, a ceramic sintered body is used. The ceramic dielectric body 20 has a plurality of protrusions 21 provided on the first major surface (surface side) 20s. In the first major surface 20s, at least one groove 22 for supplying a heat transfer gas between the first major surface 20s and the processing target substrate 50 is provided.

In a bottom face 22b of the groove 22, at least one through hole 23 penetrating to a second major surface (back face side) 10s of the ceramic substrate 10 on a side opposite the first major surface 20s. A first distance d1, which is between the electrode 30 and the groove 22, is equal to or greater than a second distance d2, which is between the electrode 30 and the ceramic dielectric body 20. At the periphery of the ceramic dielectric body 20, a ring-form protrusion 24 is provided. On a bottom side of the ceramic substrate 10, a temperature control plate 40 is provided.

The ceramic substrate 10, the ceramic dielectric body 20 and the electrode 30 are sintered together. The ceramic substrate 10 and the ceramic dielectric body 20 are, for example, alumina sintered body.

The first distance d1 is defined as the shortest length of a straight line connecting the electrode 30 and the groove 22.

For example, when a depth of the bottom face 22b of the groove 22 from the first major surface 20s of the ceramic dielectric body 20 is shallower than a major surface 30s of the electrode 30, the first distance d1 is defined as a length of a straight line connecting between a groove 22-side edge 30e of the electrode 30 and the points of intersection of a side surface 22w and the bottom face 22b of the groove 22.

The second distance d2 is the distance between the first major surface 20s of the ceramic dielectric body 20 and the major surface 30s (top face) of the electrode 30.

For example, when a depth of the bottom face 22b of the groove 22 from the first major surface 20s of the ceramic dielectric body 20 is at the same depth or deeper than the major surface 30s of the electrode 30, the first distance d1 is defined as a distance from the groove 22-side edge 30e of the electrode 30 to the side surface 22w of the groove 22 at the same depth as the electrode 30.

For the heat transfer gas, a distance between the first major surface 20s and the processing target substrate 50 is adjusted so that the gas pressure is in the molecular flow region. In this case, the gas pressure and the heat transfer coefficient are proportional to each other. Accordingly, the heat transfer coefficient between the processing target substrate 50 and the electrostatic chuck can be accurately controlled using the pressure of the heat transfer gas, making it possible to control the temperature of the processing target substrate.

When the pressure of the heat transfer gas is in the molecular flow region, the discharge starting voltage in the groove 22 is given by Paschen's Law (Paschen's curve). For example, when an applied voltage is higher than a discharge starting voltage at a position given by a product of the pressure of the heat transfer gas and the first distance d1, discharge of the heat transfer gas in the groove 22 may occur.

Figure 4:
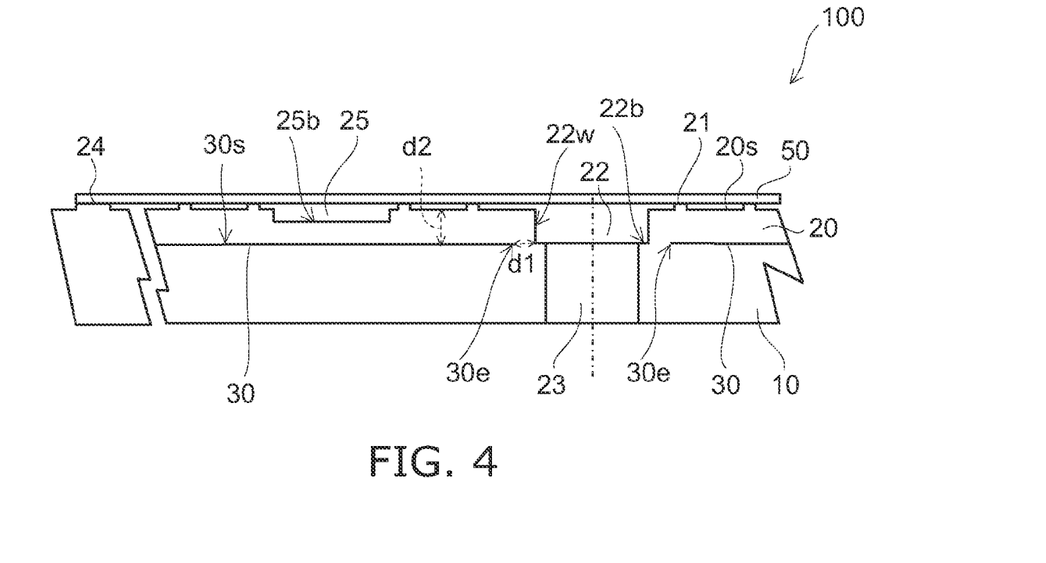
FIG. 4 is a cross-sectional view of a relevant part of an electrostatic chuck according to a comparative example.

For example, if the groove 22 is disposed to overlap the electrode 30 in the manner of the later-described electrostatic chuck 100, the first distance will be less than the second distance.

When the heat transfer gas is introduced into the groove 22 in such a state and a high voltage is applied to the electrode 30, discharge of the heat transfer gas in the groove 22 may occur. In such cases, it may be that the pressure of the heat transfer gas causes the grooves 22 to assume conductivity, meaning that insulation properties between the groove 22 and the electrode 30 to which the high voltage is applied can no longer be maintained. The end result may be insulation breakdown between the groove 22 and the electrode 30.

However, in this embodiment, the groove 22 does not overlap the electrode 30, and the first distance d1 is equal to or greater than the second distance d2. Thus, in this embodiment, Paschen's Law does not apply and it is unlikely the heat transfer gas will discharge in the groove 22 when introduced into the groove 22. Consequently, the pressure of the heat transfer gas does not cause the insides of the groove 22 to assume conductivity and strong insulation properties are maintained between the groove 22 and the electrode 30.

Even if the product of the pressure and the distance locates the breakdown voltage near the applied voltage under Paschen's Law, increasing a physical distance between the groove 22 and the electrode 30 which is an internal electrode will improve a breakdown voltage of the ceramic dielectric body and suppress insulation breakdown.

Moreover, by forming a continuous curved surface between the bottom face 22b and the side surface 22w of the groove 22, the physical distance between the groove 22 and the electrode 30 is further increased and the generation of singularities (points at which an electric field is concentrated) is inhibited. Hence, insulation breakdown is further suppressed.

Further, by disposing the plurality of protrusions 21 on the first major surface 20s of the ceramic dielectric body 20, the pressure of the heat transfer gas is caused to become uniform, variation in the surface temperature distribution of the ceramic dielectric body 20 is made less likely to occur, and the surface temperature distribution of the processing target substrate also becomes uniform.

Specifically, the diameter of each of the ceramic substrate 10 and the ceramic dielectric body 20 is 300 mm, and the combined thickness of the ceramic substrate 10 and the ceramic dielectric body 20 is 1 mm. The second distance d2, which is between the first major surface 20s of the ceramic dielectric body 20 and the major surface 30s of the electrode 30, is 0.3 mm. The distance between the opposing electrodes 30 is 3.0 mm. The width of the groove 22 is 1.0 mm.

The depth of the groove 22 is 0.1 mm. The groove 22 is disposed centrally between the opposing electrodes 30. The first distance d1, which is between the electrode 30 and the groove 22-side edge 30e of the electrode 30, is given by the square root of $((1\ mm)^2+(0.2\ mm)^2)$, which is 1.020 mm.

A volume resistivity at ambient temperature of the ceramic dielectric body 20 is not less than $1\times10^{14}\ \Omega\cdot cm$. Specifically, the electrostatic chuck 1 is a Coulomb-type electrostatic chuck. The thickness of the ceramic substrate 10 is greater than the thickness of the ceramic dielectric body 20. By making the thickness of the ceramic substrate 10 greater than the thickness of the ceramic dielectric body 20, warping of the ceramic dielectric body 20 is suppressed.

Thus, in the electrostatic chuck 1, a depth from the first major surface 20s of the ceramic dielectric body 20 to the bottom face 22b of the groove 22 is the same as or less than the depth from the first major surface 20s to the major surface 30s of the electrode 30.

When the depth from the first major surface 20s of the ceramic dielectric body 20 to the bottom face 22b of the groove 22 is set to be the same as or less than the depth from the first major surface 20s of the ceramic dielectric body 20 to the major surface 30s of the electrode 30, the first distance d1, which is between the electrode 30 and the groove 22, is lengthened by corresponding amount, thereby improving the insulation properties between the electrode 30 and the groove 22.

In the case that the groove 22 is processed by a grinding or sandblasting process, making the processed groove 22 shallower brings a corresponding reduction in the cumulative processing load. Hence, it is less likely that microcracking will occur in the bottom face 22b of the grooves 22. Consequently it is less likely that a current leakage path will be formed through a microcrack.

Also, in the electrostatic chuck 1, a depth from the first major surface 20s to the bottom face 22b of the groove 22 is the same as or less than the width of the groove 22. Here, the width of the groove 22 refers to a width of the groove when a cross-section of the groove 22 is taken perpendicular to the direction in which the groove 22 extends.

By making the depth from the first major surface 20s of the ceramic dielectric body 20 to the bottom face 22b of the groove 22 less than the width of the groove 22, a groove process depth can be made shallower. As a result, it is less likely that variation will occur in groove depth, even when processing the grooves 22 by grinding or sandblasting. Moreover a conductance of the heat transfer gas within the groove 22 is set closer to being constant, making the gas distribution rate more uniform.

The following describes manufacturing processes for representative constituent components of the electrostatic chuck 1.

The ceramic substrate 10 and the ceramic dielectric body 20 are formed using the following manufacturing process. For example, granulated powder is manufactured by adding an acrylic binder to alumina ingredient powder with an average particle size of 0.1 μm and a purity of not less than 99.99%, and forming grains using a spray drier. Thereafter, CIP (rubber press) or press forming is performed to process the granules to a predetermined form, and the arrangement is then sintered in an atmospheric air at temperature of 1250 to 1450° C.

Next, Hot Isostatic Press (HIP) processing is performed. For the HIP conditions, Ar gas at a pressure of not less than 1000 bar, and a temperature of 1250° C. to 1450° C. equal to the sintering temperature are used. Under such conditions, the ceramic substrate 10 and the ceramic dielectric body 20 are prepared with great precision to have a constituent average particle size of not more than 2 μm, a volume resistivity of not less than $1 \times 10^{14}$ Ω·cm at 20±3° C., a purity of not less than 99%, a thermal conductivity of not less than 30 W/mK, and a breakdown voltage of not less than 20 kV (at thickness of 1 mm). Moreover, by using a ceramic sintered body as the ceramic substrate 10 and the ceramic dielectric body 20, the insulation properties of the various parts of the ceramic dielectric body are made uniform and the reliability of the electrostatic chuck 1 is improved.

The ceramic substrate 10 and the temperature control plate 40 are bonded together using a silicone bonding agent. The silicone bonding agent according to this embodiment is a 2-liquid type. Hence, very little gas is generated when the silicone bonding agent is cured. Since curing takes place as a result of heating and contact between the media, such bonding agents offer excellent curing properties at depth. There also exist types of silicone bonding agent which can be cured at ambient temperature. However, such types have poor curing properties at depth, generate gas which causes voids when curing, and are not therefore preferable. These bonding agents also take a long time to cure (not less than 72 hours), which is further reason that they are not preferable.

The silicone bonding agent according to this embodiment is mixed with and dispersed in a ceramic amorphous filler. Accordingly, the silicone bonding agent has a high thermal conductivity. Further, to prevent concentration of stress in the ceramic substrate 10 and the ceramic dielectric body 20, a spherical filler is also mixed with and dispersed in the silicone bonding agent to keep a uniform thickness. An average particle size of the spherical filler is set to be greater than the maximum length of the breadth of the amorphous filler.

The silicone bonding agent having the amorphous filler and the spherical filler mixed and dispersed therein is coated on the face to be bonded of each the ceramic substrate 10 and the temperature control plate. The arrangement then is placed into a vacuum chamber and bonded together while performing a process to remove bubbles.

Thereafter, prior to curing of the silicone bonding agent, the ceramic dielectric body and the temperature control plate are brought into atmospheric air and provisionally cured in a hot press machine while controlling a thickness of the silicone bonding agent. After the hot press, excess silicone bonding agent, which has been squeezed out from the sides, is removed and the arrangement is fully cured by applying heat.

After bonding the ceramic substrate 10 and the temperature control plate 40, the first major surface 20s of the ceramic dielectric body 20 is ground, before performing lapping and polishing processing or the like. Accordingly, the surface roughness of the adhering face can be removed. Thereafter, portions other than the groove 22 are masked using a photoresist method, and the groove 22 is cut to a stipulated depth by sandblasting. Next, the portions which are to form the protrusions 21 and the ring-form protrusion 24 are masked using a photoresist method, and the protrusions 21 and the ring-form protrusion 24 are formed by sandblasting.

Next, a planar form of the electrode 30 will be described.

Figure 2A:
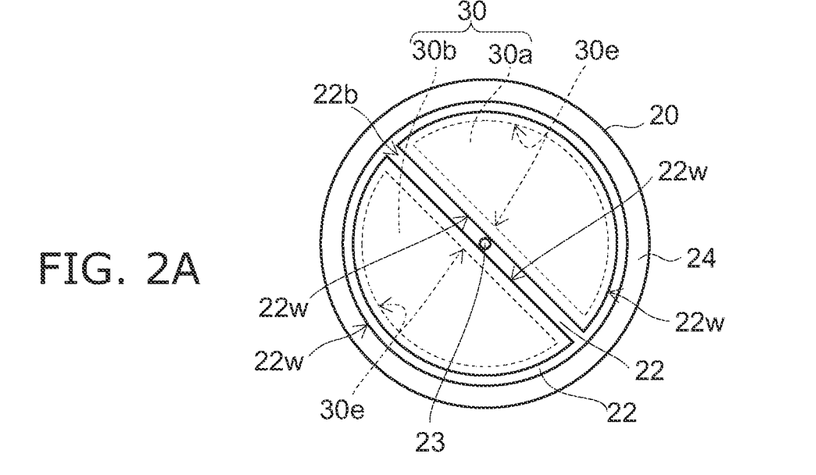
FIG. 2A is a plan view of a first electrode.
Figure 2B:
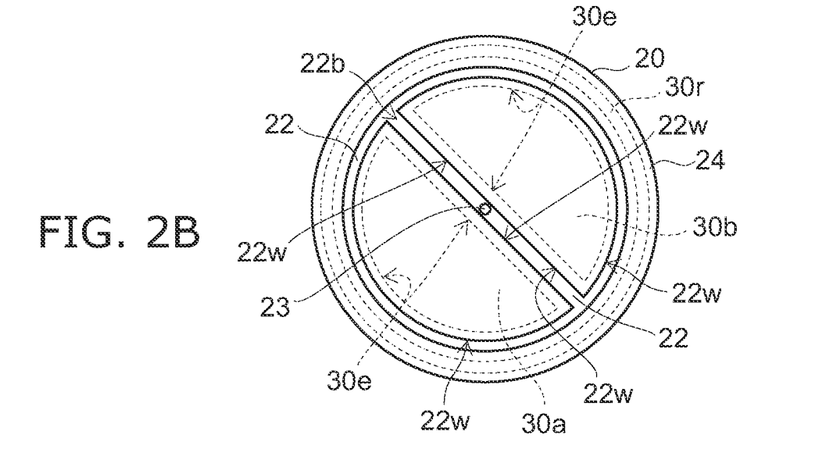
FIG. 2B is a plan view of a second electrode.
Figure 2C:
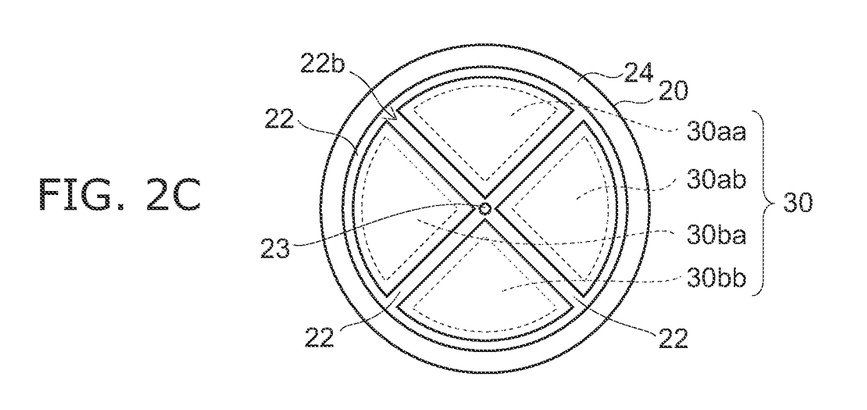
FIG. 2C is a plan view of a third electrode.

FIGS. 2A, 2B and 2C are schematic views of planar forms of the electrode. FIG. 2A is a plan view of a first electrode, FIG. 2B is a plan view of a second electrode, and FIG. 2C is a plan view of a third electrode. FIGS. 2A, 2B and 2C are views of the electrostatic chuck 1 along a direction perpendicular to the first major surface 20s of the ceramic dielectric body 20.

The electrode 30 shown in FIG. 2A has at least one pair of electrodes. For example, two semicircular electrodes 30a and 30b are disposed opposing each other. The groove 22 provided at a center of the electrostatic chuck 1 is provided between the electrode 30a and the electrode 30b. Further, the edges 30e of the electrodes 30a and 30b are, at all locations, drawn back from the side surface 22w of the groove 22 towards the inside of the electrodes 30a and 30b. In other words, when the electrostatic chuck 1 is viewed along a direction perpendicular to the first major surface 20s of the ceramic dielectric body 20, a constant distance is seen to be provided between the edges 30e of the electrodes 30a and 30b and the side surfaces 22w of the groove 22.

When the electrodes 30a and 30b form a single pair of bipolar electrodes, voltages of mutually different polarity can be applied to the first electrode 30a and the second electrode 30b of the bipolar electrodes. The first electrode 30a and the second electrode 30b are separated by a gap. Here, the groove 22 is disposed between the first electrode 30a and the second electrode 30b.

Disposing the groove 22 between the separated bipolar electrodes makes it possible to set the above-described first distance d1 to be greater than or equal to the second distance d2, which is between the major surface of the electrodes 30a and 30b and the first major surface 20s of the ceramic dielectric body 20. As a result, the insulation properties between the electrode 30 and the groove 22 can be set to be stronger than the insulation properties between the electrode 30 and the first major surface 20s of the ceramic dielectric body 20.

Alternatively, voltages of the same polarity may be applied to the respective electrodes (electrode elements) 30a and 30b. In this case, since voltages of the same polarity are applied to each of the electrodes 30a and 30b it is less likely that so-called potential irregularity will occur within the face of the processing target substrate 50 when performing plasma processing on the processing target substrate 50.

Further, as shown in FIG. 2B, a ring-form electrode 30r may be provided in positions around the periphery of the ceramic dielectric body 20. Accordingly, it is less likely that so-called potential irregularity will occur within the face of the processing target substrate 50.

Further, in the electrode 30 shown in FIG. 2C, the semicircular electrodes 30a and 30b may be split into a further two parts. Here, a positive voltage is applied to a set of electrode 30aa and electrode 30bb and a negative voltage is applied to a set of electrode 30ab and electrode 30ba. Alternatively, voltages of the same polarity may be applied to the electrodes (electrode elements) 30aa, 30ab, 30ba and 30bb. This electrode shape is also included in this embodiment.

Note that there are no limitations on the shape of the electrode 30 and the groove 22. For example, the electrode may have any desired shape including a comb-shape, concentric-circle shape, an alphabet C-shape, and the like. Note, however, that the groove 22 must be disposed between the electrodes.

Figure 3A:
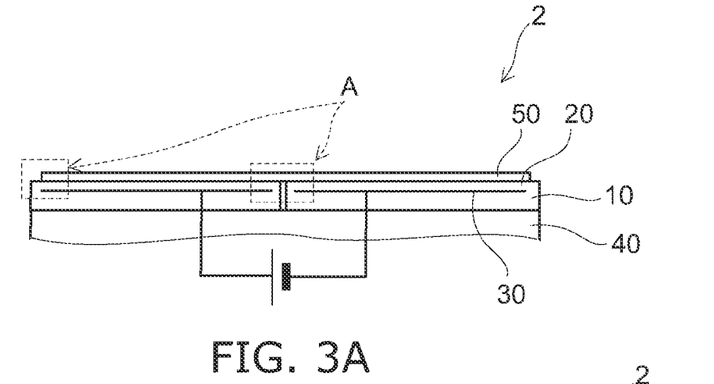
FIG. 3A is a cross-sectional view of a relevant part of a variation of an electrostatic chuck.
Figure 3B:
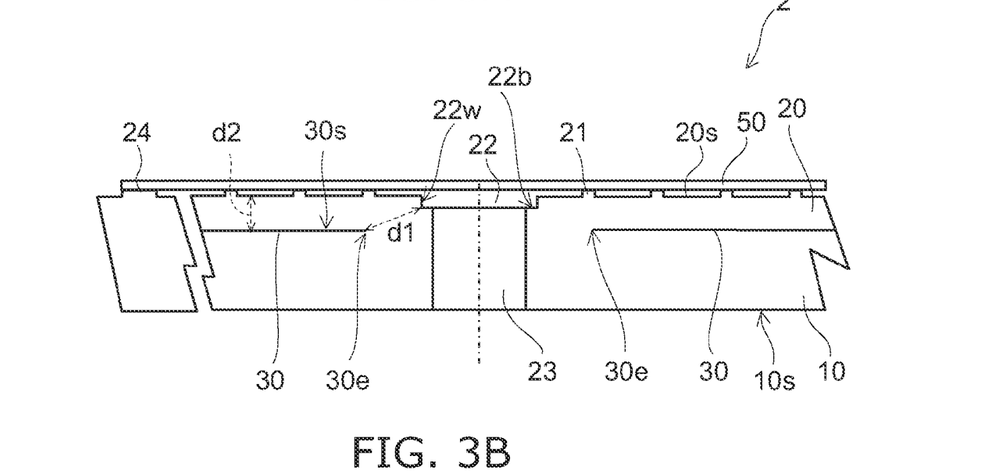
FIG. 3B is a magnified view of a surrounded portion A in FIG. 3A.

FIG. 3A is a cross-sectional view of a relevant part of a variation of an electrostatic chuck, and FIG. 3B is a magnified view of a surrounded portion A in FIG. 3A. In FIG. 3B, a central portion and a peripheral portion from FIG. 3A are shown together.

An electrostatic chuck 2 shown in FIGS. 3A and 3B have the same basic configuration as the electrostatic chuck 1. In the electrostatic chuck 2, the first distance d1 of the electrostatic chuck 2 is shorter than the first distance d1 of the electrostatic chuck 1. Note, however, that in the electrostatic chuck 2 the condition of the first distance d1 being greater than or equal to the second distance d2 is satisfied Specifically, the diameter of each of the ceramic substrate 10 and the ceramic dielectric body 20 is 300 mm, and the combined thickness of the ceramic substrate 10 and the ceramic dielectric body 20 is 1 mm. The second distance d2, which is between the first major surface of the ceramic dielectric 20 and the major surface 30s of the electrode 30, is 0.3 mm. The distance between the opposing electrodes 30 is 2.0 mm. The width of the groove 22 is 1.0 mm. The depth of the groove 22 is 0.1 mm. The groove 22 is disposed centrally between the opposing electrodes 30. The first distance d1, which is between the groove 22 and the groove 22-side edge 30e of the electrode 30, is given by the square root of (0.5 mm)$^2$+(0.2 mm)$^2$, which is 0.539 mm.

In the electrostatic chuck 2, the ceramic dielectric body 20 and the ceramic substrate 10 are sintered separately and subsequently adhered together. The electrode 30 is formed in advance on the ceramic dielectric body 20 side, and the ceramic substrate 10 and the ceramic dielectric body 20 are bonded together so as to sandwich the electrode 30. Hence, the electrode 30 is formed after the sintering of the ceramic substrate 10 and the ceramic dielectric body 20. Consequently, the electrode 30 is unlikely to be affected by sintering contraction and the desired pattern can be obtained.

In this embodiment, similar effects to the electrostatic chuck 1 are obtained. Further, the area of the electrode 30 of the electrostatic chuck 2 is larger than the area of the electrode 30 in the electrostatic chuck 1, and a corresponding increase in the strength of the electrostatic force is obtained.

Lastly, an electrostatic chuck 100 is described as a comparative example.

FIG. 4 is a cross-sectional view of a relevant part of the electrostatic chuck according to the comparative example.

In the electrostatic chuck 100, the diameter of each of the ceramic substrate 10 and the ceramic dielectric body 20 is 300 mm, and the combined thickness of the ceramic substrate 10 and the ceramic dielectric body 20 is 1 mm. The second distance d2, which is between the first major surface of the ceramic dielectric body 20 and the major surface 30s of the electrode 30, is 0.3 mm. The distance between the opposing electrodes 30 is 1.4 mm. The width of the groove 22 is 1.0 mm. The depth of the groove 22 is 0.3 mm. The groove 22 is disposed centrally between the opposing electrodes 30. Accordingly, the first distance d1, which is between the groove 22 and the groove 22-side edge 30e of the electrode 30, is 0.2 mm.

In the electrostatic chuck 100, the first distance d1, which is between the electrode 30 and the groove 22, is less than the second distance d2, which is between the electrode 30 and the first major surface 20s of the ceramic dielectric body 20. In other words, in the electrostatic chuck 100, the edge 30e of the electrode 30 is closer to the side surface 22w of the groove 22 than in either of the electrostatic chucks 1 and 2. Thus, when a high voltage is applied to the electrode 30, insulation breakdown may occur between the edge 30e of the electrode 30 and the side surface 22w of the groove 22.

Further, the electrode 30 is provided directly below another groove 25 provided in the first major surface 20s of the ceramic dielectric body 20. In other words, the groove 25 and the electrode 30 overlap. In such a case, insulation breakdown may occur between a bottom face 25b of the groove 25 and the major surface 30s of the electrode 30.

By contrast, the electrostatic chucks 1 and 2 are configured to make it difficult for insulation breakdown to occur. The electrostatic chucks 1 and 2 include the temperature control plate 40 with the heat transfer gas being supplied between the processing target substrate 50 and the first major surface 20s of the ceramic dielectric body 20. Thus, when using the electrostatic chucks 1 and 2, it is possible to rapidly heat and cool the processing target substrate 50.

Figure 5A:
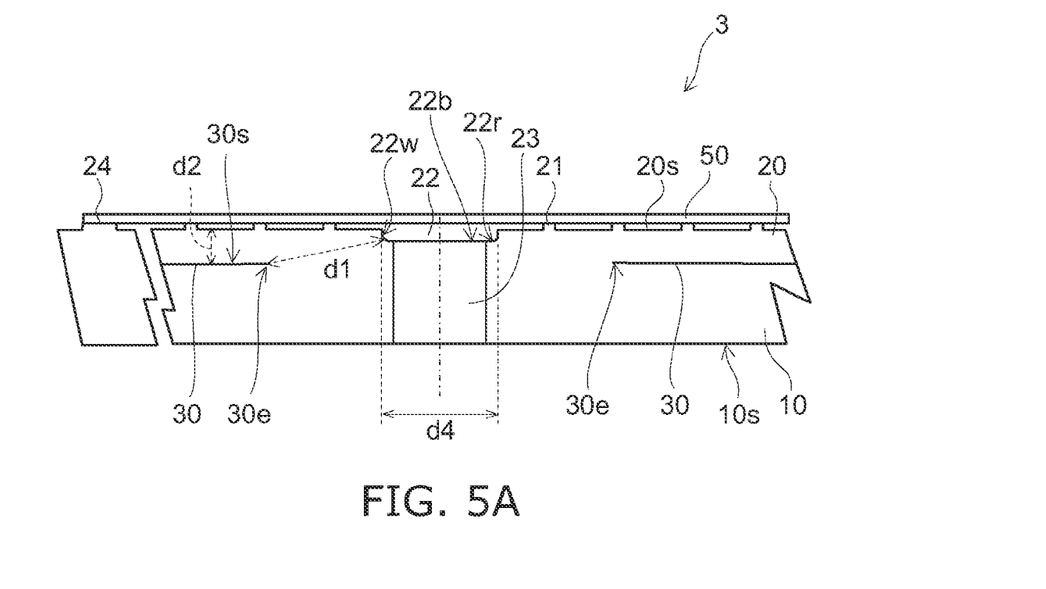
FIG. 5A is a cross-sectional view of a relevant part of another variation of an electrostatic chuck.
Figure 5B:
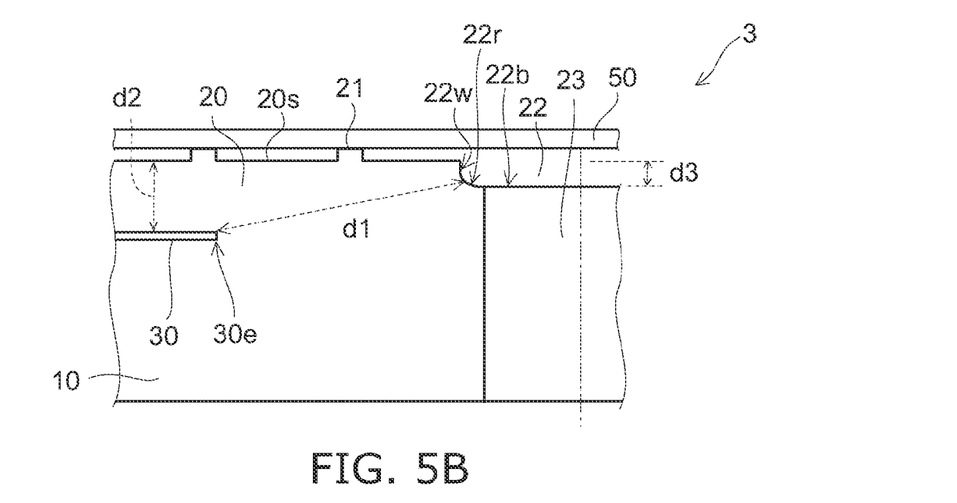
FIG. 5B is a magnified view of a portion in FIG. 5A.

FIG. 5A is a cross-sectional view of a relevant part of another variation of the electrostatic chuck, and FIG. 5B is a magnified view of a portion in FIG. 5A.

In an electrostatic chuck 3, at an edge region of the groove 22, a tapered portion 22r with a depth of the groove 22 becoming gradually shallower towards an edge of the groove 22 is provided. When the processing target substrate 50, which is an adhering target, is electrostatically adhered to the first major surface 20s of the ceramic dielectric body 20 and the groove 22 is filled with heat transfer gas, linear intersections between the side surfaces 2w and the bottom face 22b of the groove 22 form singularities (points at which an electric field is concentrated), making it easier for discharge breakdown to occur between the groove 22 and the electrode 30. By contrast, when the tapered portion 22r, where the depth of the groove 22 becomes gradually shallower towards the edge of the groove 22, is provided in edge regions of the groove 22 in the manner of this embodiment, the singularity within the groove 22 disappears, concentration of the electric field is suppressed and discharge breakdown becomes less likely to occur.

For example, in FIG. 5, a continuous curved surface is shown as an example of the tapered portion 22r. In the groove 22, the side surface 22w and the bottom face 22b are linked by a continuous curved surface. The continuous curved surface can be formed by, for example, sandblasting. For instance, when the form of the curved surface can approach an R-form, the size of R (R size) is not less than 0.5 times a depth d3 of the groove 22 and not more than 0.5 times a width d4 of the groove 22.

If the R size is less than 0.5 times d3, it becomes easier for a singularity (a point at which an electric field is concentrated) to form between the electrode 30 and the groove 22 when the groove 22 is filled with the heat transfer gas, and for discharge breakdown to occur. On the other hand, if the R size is greater than 0.5 times the width d4 of the groove 22, either the tapered portion 22r cannot be fully contained in the groove 22, or the depth at a center of the groove 22 does not reach the predetermined depth d3. If the depth of the groove 22 does not reach the predetermined depth d3, the conductance of the groove 22 will drop, and the Takt time for introducing and emitting the heat transfer gas will be lengthened.

Further, the R size may have the size indicated in FIG. 6 below as an upper limit.

Figure 6:
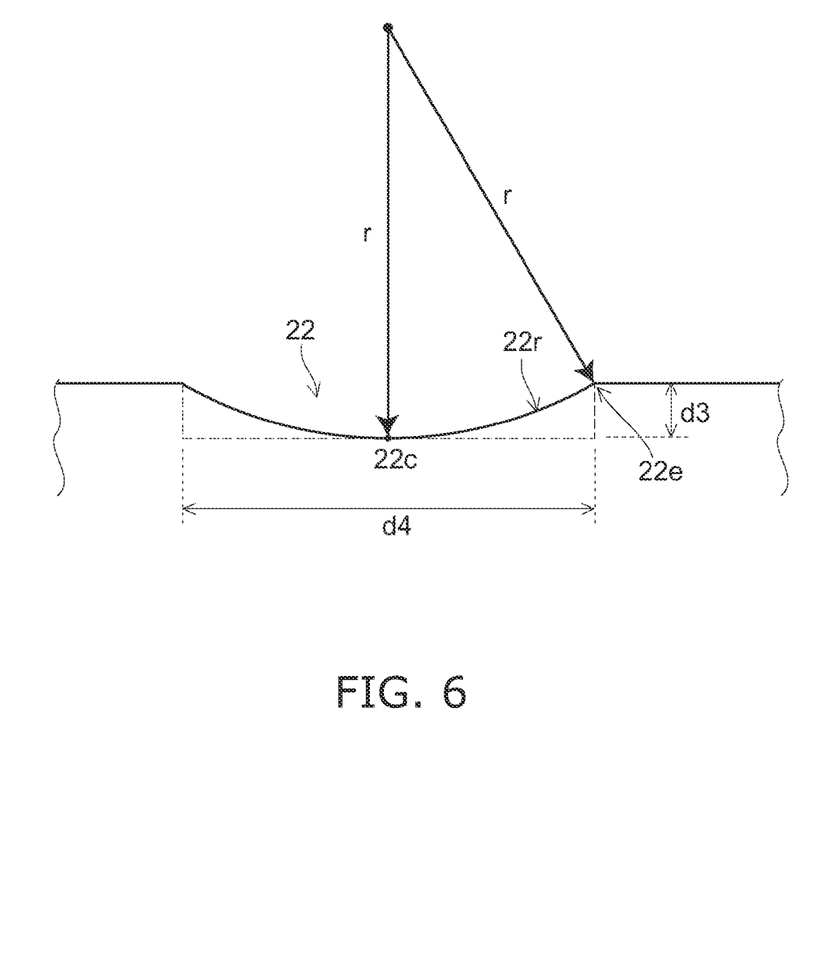
FIG. 6 is a schematic cross-sectional view of a groove periphery in the electrostatic chuck.

FIG. 6 is a schematic cross-sectional view of a groove periphery in the electrostatic chuck.

When the curved surface of the tapered portion 22r is assumed to be arc with a radius r, the radius r of the arc, which contacts an upper edge 22e of the groove 22 and the center 22c of the bottom face 22b of the groove 22, will be an upper limit value for the R size.

The upper limit value for radius r is expressed by (½)•d3+d4$^2$/(8•d3), and so (Upper limit value for R size)≤(½)•d3+d4$^2$/(8•d3).

For example, the width d4 of the groove 22 may be 0.5 to 1 mm, and the depth d3 of the groove 22 may be 0.1 mm.

The invention has been described with reference to the embodiments. However, the invention is not limited to these descriptions. Those skilled in the art can suitably modify the above embodiments by design change, and such modifications are also encompassed within the scope of the invention as long as they include the feature of the invention. For example, the shape, dimension, materials and disposal of components are not limited to those illustrated, and can be suitably modified.

Components of the embodiments described above can be combined and multiple as long as technically possible, and such combinations can be encompassed within the scope of the invention as long as they include the feature of the invention.

INDUSTRIAL APPLICABILITY

The invention is for use as an electrostatic chuck for holding and fixing a processing target substrate.

REFERENCE SIGNS LIST 1, 2, 100 electrostatic chuck
10 ceramic substrate
10s second major surface
20 dielectric body
20s first major surface
21 protrusion
22, 25 groove
22b, 25b bottom face
22r tapered portion
22w side surface
23 through hole
24 ring-form protrusion
30, 30a, 30b, 30r electrode
30e edge
30s major surface
40 temperature control plate
50 processing target substrate
d1 first distance
d2 second distance

The invention claimed is:

1. An electrostatic chuck comprising:
a ceramic substrate;
a ceramic dielectric body provided on a top side of the ceramic substrate and having a first major surface where a processing target substrate is to be mounted; and
an electrode provided between the ceramic substrate and the ceramic dielectric body,
a material of the ceramic dielectric body being a ceramic sintered body,
a plurality of protrusions and a groove for supplying a gas being provided on the first major surface of the ceramic dielectric body,
a through hole being provided in a bottom face of the groove, the through hole penetrating to a second major surface of the ceramic substrate on a side opposite to the first major surface,
a distance between the electrode and the groove being greater than or equal to a distance between the electrode and the first major surface, and
a depth from the first major surface to the bottom face of the groove is less than or equal to a depth from the first major surface to a major surface of the electrode.

2. The electrostatic chuck according to claim 1, wherein the electrode includes at least a pair of bipolar electrodes,
a voltage having a polarity is applicable to one electrode of the bipolar electrodes and a voltage having a different polarity is applicable to one other electrode of the bipolar electrodes,
the one electrode and the one other electrode are provided separately, and
the groove is provided between the one electrode and the one other electrode.

3. The electrostatic chuck according to claim 1, wherein the electrode includes a plurality of electrode elements,
a voltage of a same polarity is applicable to each of the plurality of electrode elements,
the plurality of electrode elements are mutually provided separately, and
the groove is provided between the separated plurality of electrode elements.

4. An electrostatic chuck comprising:
a ceramic substrate;
a ceramic dielectric body provided on a top side of the ceramic substrate and having a first major surface where a processing target substrate is to be mounted; and
an electrode provided between the ceramic substrate and the ceramic dielectric body,
a material of the ceramic dielectric body being a ceramic sintered body,
a plurality of protrusions and a groove for supplying a gas being provided on the first major surface of the ceramic dielectric body,
a through hole being provided in a bottom face of the groove, the through hole penetrating to a second major surface of the ceramic substrate on a side opposite to the first major surface,
a distance between the electrode and the groove being greater than or equal to a distance between the electrode and the first major surface, and
a depth from the first major surface to the bottom face of the groove is less than a width of the groove.

5. The electrostatic chuck according to claim 4, wherein a tapered portion with a depth becoming gradually shallower toward an edge of the groove is provided at an edge region of the groove.

6. The electrostatic chuck according to claim 4, wherein a volume resistivity at ambient temperature of the ceramic dielectric body is not less than $1 \times 10^{14} \Omega \cdot cm$.

7. The electrostatic chuck according to claim 4, wherein a thickness of the ceramic substrate is greater than a thickness of the ceramic dielectric body.

8. The electrostatic chuck according to claim 1, wherein a tapered portion with a depth becoming gradually shallower toward an edge of the groove is provided at an edge region of the groove.

9. The electrostatic chuck according to claim 1, wherein a volume resistivity at ambient temperature of the ceramic dielectric body is not less than $1 \times 10^{14} \Omega \cdot cm$.

10. The electrostatic chuck according to claim 1, wherein a thickness of the ceramic substrate is greater than a thickness of the ceramic dielectric body.

11. The electrostatic chuck according to claim 4, wherein the electrode includes at least a pair of bipolar electrodes,
a voltage having a polarity is applicable to one electrode of the bipolar electrodes and a voltage having a different polarity is applicable to one other electrode of the bipolar electrodes,
the one electrode and the one other electrode are provided separately, and
the groove is provided between the one electrode and the one other electrode.

12. The electrostatic chuck according to claim 4, wherein the electrode includes a plurality of electrode elements, a voltage of a same polarity is applicable to each of the plurality of electrode elements, the plurality of electrode elements are mutually provided separately, and the groove is provided between the separated plurality of electrode elements.

* * * * *